(12) United States Patent
Low et al.

(10) Patent No.: US 10,359,565 B2
(45) Date of Patent: Jul. 23, 2019

(54) OPTOELECTRONIC CIRCUIT HAVING ONE OR MORE DOUBLE-SIDED SUBSTRATES

(71) Applicant: Alcatel-Lucent USA Inc., Murray Hill, NJ (US)

(72) Inventors: Yee L. Low, New Providence, NJ (US); Nagesh Basavanhally, Skillman, NJ (US)

(73) Assignee: NOKIA OF AMERICA CORPORATION, Murray Hill, NJ (US)

( * ) Notice: Subject to any disclaimer, the term of this patent is extended or adjusted under 35 U.S.C. 154(b) by 0 days.

(21) Appl. No.: 15/426,729

(22) Filed: Feb. 7, 2017

(65) Prior Publication Data

US 2018/0224601 A1    Aug. 9, 2018

(51) Int. Cl.
*G02B 6/12* (2006.01)
*G02B 6/42* (2006.01)
(Continued)

(52) U.S. Cl.
CPC ..... *G02B 6/12002* (2013.01); *G02B 6/12004* (2013.01); *G02B 6/4232* (2013.01);
(Continued)

(58) Field of Classification Search
CPC ............ G02B 6/12002; G02B 6/12004; G02B 6/4332; H05K 1/0274; H05K 1/115; H05K 1/144; H05K 1/181
(Continued)

(56) References Cited

U.S. PATENT DOCUMENTS 6,864,577 B2   3/2005   Clatanoff et al.
7,387,913 B2   6/2008   Yoshimura et al.
(Continued)

FOREIGN PATENT DOCUMENTS

EP    1814372 A1    8/2007
EP    3067926 A1    9/2016

OTHER PUBLICATIONS

Fischer, A. C., et al., "High aspect ratio TSVs fabricated by magnetic self-assembly of gold-coated nickel wires," IEEE 62nd Electronic Components and Technology Conference (ECTC), 2012 (Abstract, 7 pages).

(Continued)

*Primary Examiner* — Ryan A Lepisto
(74) *Attorney, Agent, or Firm* — Mendelsohn Dunleavy, P.C.; Yuri Gruzdkov (57) ABSTRACT

An optoelectronic circuit having a substantially planar double-sided substrate, each side of which has a respective plurality of electrically conducting tracks and a respective plurality of planar optical waveguides. The substrate also has at least one via crossing the substrate in a manner that can be used to establish an optical path across the substrate, e.g., between optical waveguides located on different sides thereof. In an example embodiment, the electrically conducting tracks and planar optical waveguides are configured to operatively connect various optoelectronic devices and auxiliary electrical circuits attached to the two sides of the substrate using hybrid-integration technologies. In some embodiments, two or more of such double-sided substrates can be stacked and optically and electrically interconnected to create an integrated three-dimensional assembly.

11 Claims, 4 Drawing Sheets

(51) Int. Cl.
    *H05K 1/02*     (2006.01)
    *H05K 1/11*     (2006.01)
    *H05K 1/14*     (2006.01)
    *H05K 1/18*     (2006.01)
    *G02B 6/43*     (2006.01)

(52) U.S. Cl.
    CPC ............. *G02B 6/43* (2013.01); *H05K 1/0274* (2013.01); *H05K 1/115* (2013.01); *H05K 1/144* (2013.01); *H05K 1/181* (2013.01); *G02B 2006/12104* (2013.01); *H05K 2201/10734* (2013.01)

(58) Field of Classification Search
    USPC .......................................................... 385/114
    See application file for complete search history.

(56) References Cited

U.S. PATENT DOCUMENTS

| | | | |
|---|---|---|---|
| 7,580,605 B2 * | 8/2009 | Ishida | G02B 6/12002 |
| | | | 385/129 |
| 8,309,461 B2 | 11/2012 | Krestnikov et al. | |
| 8,502,386 B2 | 8/2013 | Jiang et al. | |
| 8,750,654 B2 | 6/2014 | Dupuis et al. | |
| 9,110,234 B2 * | 8/2015 | Terada | G02B 6/43 |
| 2002/0118907 A1 * | 8/2002 | Sugama | G02B 6/12002 |
| | | | 385/14 |
| 2004/0091719 A1 | 5/2004 | Uchida | |
| 2004/0245538 A1 | 12/2004 | Wang et al. | |
| 2005/0191004 A1 * | 9/2005 | Hosino | H04Q 11/0005 |
| | | | 385/14 |
| 2006/0263003 A1 * | 11/2006 | Asai | G02B 6/4204 |
| | | | 385/14 |
| 2008/0285910 A1 * | 11/2008 | Yamada | G02B 6/12002 |
| | | | 385/14 |
| 2009/0003761 A1 * | 1/2009 | Matsuoka | G02B 6/42 |
| | | | 385/14 |
| 2009/0256251 A1 | 10/2009 | Getz et al. | |
| 2010/0133697 A1 | 6/2010 | Nilsson | |
| 2010/0135611 A1 * | 6/2010 | Asai | G02B 6/43 |
| | | | 385/14 |
| 2013/0108211 A1 | 5/2013 | Kwok et al. | |
| 2014/0355931 A1 * | 12/2014 | Tummala | G02B 6/43 |
| | | | 385/14 |
| 2015/0234124 A1 * | 8/2015 | Won | G02B 6/30 |
| | | | 385/14 |
| 2016/0143125 A1 * | 5/2016 | Dang | H05K 1/0203 |
| | | | 174/252 |

OTHER PUBLICATIONS

Fischer, A. C., et al., "High aspect ratio TSVs fabricated by magnetic self-assembly of gold-coated nickel wires," In Electronic Components and Technology Conference (ECTC), 2012 IEEE 62nd, pp. 541-547.

International Search Report and Written Opinion; dated Apr. 18, 2018 for PCT Application No. PCT/US2018/015658.

Brusberg, L., et al. "Photonic system-in-package technologies using thin glass substrates." In 2009 11th Electronics Packaging Technology Conference (pp. 930-935). IEEE.

\* cited by examiner

OPTOELECTRONIC CIRCUIT HAVING ONE OR MORE DOUBLE-SIDED SUBSTRATES

BACKGROUND

Field

The present disclosure relates to optical communication equipment and, more specifically but not exclusively, to an optoelectronic circuit having one or more double-sided substrates.

Description of the Related Art

This section introduces aspects that may help facilitate a better understanding of the disclosure. Accordingly, the statements of this section are to be read in this light and are not to be understood as admissions about what is in the prior art or what is not in the prior art.

An optoelectronic device can operate on both light and electrical currents (voltages) and may include one or more of: (i) an electrically driven light source, such as a laser diode; (ii) an optical amplifier; (iii) an optical-to-electrical converter, such as a photodiode; and (iv) an optoelectronic component that can control the propagation and/or certain properties of light, such as an optical modulator or a switch. The corresponding optoelectronic circuit may additionally include one or more optical elements and/or one or more electronic components that enable the use of the circuit's optoelectronic devices in a manner consistent with the circuit's intended function.

Different hybrid-integration technologies can be used to combine various (such as the above-mentioned) components of an optoelectronic circuit into a practically useful integrated circuit, package, and/or assembly. While each of these technologies may offer significant respective benefits and/or advantages in certain types of applications, hybrid integration continues to evolve by providing more-narrowly tailored solutions to specific segments of the market. For example, several product-specific factors typically need to be considered before the most appropriate integration method can be selected or developed.

SUMMARY OF SOME SPECIFIC EMBODIMENTS

Disclosed herein are various embodiments of an optoelectronic circuit having a substantially planar double-sided substrate, each side of which has a respective plurality of electrically conducting tracks and a respective plurality of planar optical waveguides. The substrate may also have at least one via crossing the substrate in a manner that can be used to establish an optical path across the substrate, e.g., between optical waveguides located on different sides thereof. In an example embodiment, the electrically conducting tracks and planar optical waveguides are configured to operatively connect various optoelectronic devices and auxiliary electrical circuits attached to the two sides of the substrate using hybrid integration.

In some embodiments, two or more of such double-sided substrates can be stacked and optically and electrically interconnected to create an integrated three-dimensional assembly.

The disclosed optoelectronic circuits may advantageously have a higher density of optical/electrical components and shorter optical and electrical interconnections than typical functionally comparable conventional circuits. These and other pertinent characteristics of the disclosed optoelectronic circuits can beneficially be used, e.g., to reduce optical and/or electrical losses, decrease the form factor, and improve the functionality of the corresponding products.

According to one embodiment, provided is an apparatus comprising: a planar substrate having opposing first and second surfaces; a first planar optical waveguide located at the first surface; a second planar optical waveguide located at the second surface; a first optoelectronic device located at the first surface; and a second optoelectronic device located at the second surface; and wherein the planar substrate has a via crossing said substrate and configured to optically connect the first planar optical waveguide and the second planar optical waveguide.

According to another embodiment, provided is an apparatus comprising: a stack of two or more planar substrates, each having respective opposing first and second surfaces and a respective planar optical waveguide located at one of said first and second surfaces thereof; and wherein the respective planar optical waveguides of two of the two or more planar substrates are optically connected via a respective optical path that passes through at least one via crossing a respective substrate of the two or more planar substrates of the stack.

BRIEF DESCRIPTION OF THE DRAWINGS

Other aspects, features, and benefits of various disclosed embodiments will become more fully apparent, by way of example, from the following detailed description and the accompanying drawings, in which.

DETAILED DESCRIPTION

Figure 1:
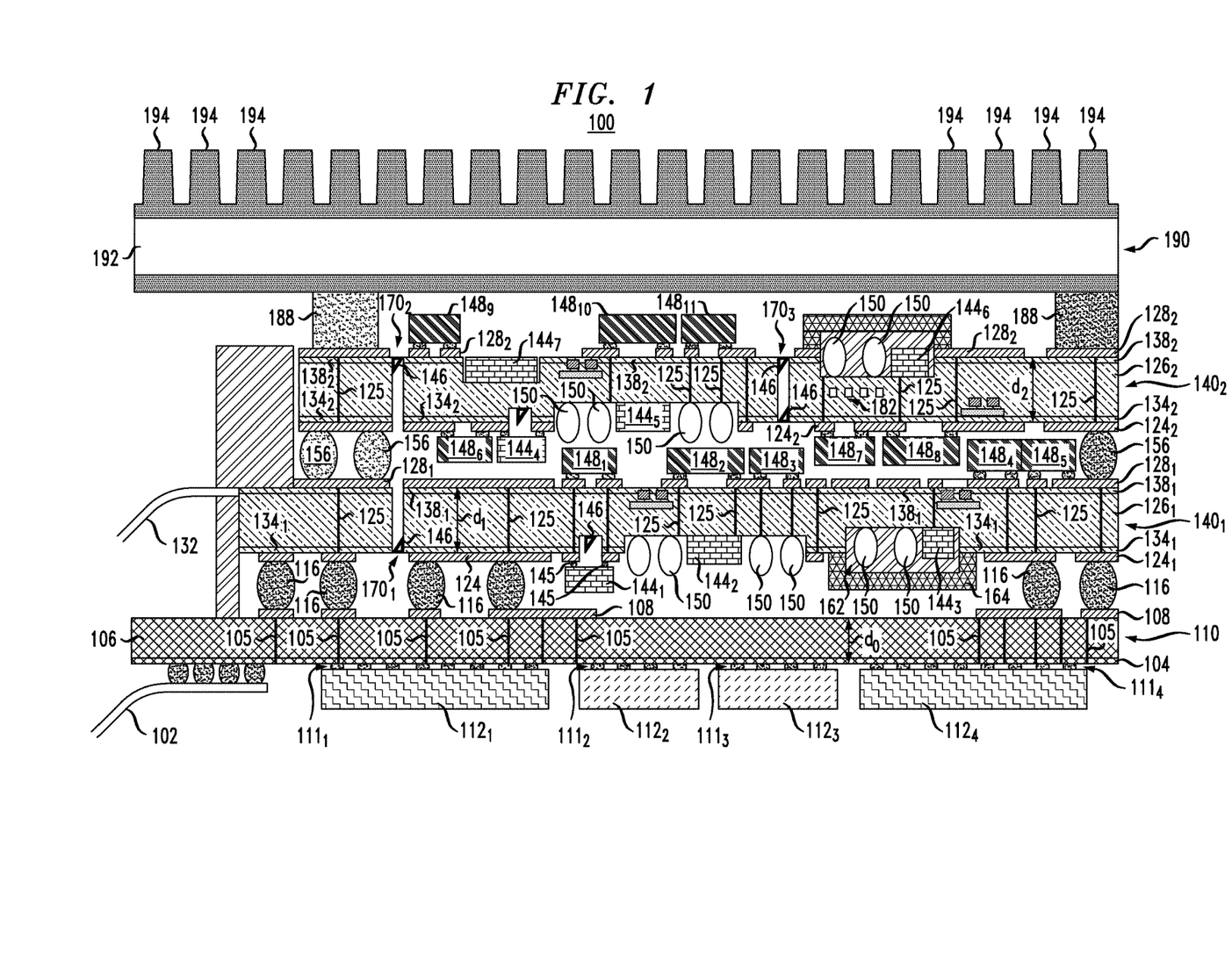
FIG. 1 shows a schematic side view of an optoelectronic circuit according to an embodiment.

FIG. 1 shows a schematic side view of an optoelectronic circuit 100 according to an embodiment. Optoelectronic circuit 100 comprises an electrical circuit 110, planar lightwave circuits (PLCs) $140_1$ and $140_2$, and a heat sink 190. Circuits 110, $140_1$, and $140_2$ and heat sink 190 are attached to one another, e.g., as indicated in FIG. 1, to form a mechanically robust stack, package, and/or assembly. A person of ordinary skill in the art will understand that, in an alternative embodiment, optoelectronic circuit 100 may include more than one electrical circuit that is similar to electrical circuit 110 and/or a different number of PLCs, each similar to a PLC 140.

Electrical circuit 110 and PLCs $140_1$ and $140_2$ are electrically interconnected as described in more detail below. Electrical circuit 110 is further electrically connected to one or more external electrical circuits and/or devices using a plurality of electrical leads (e.g., wires) 102, only one of which is explicitly shown in FIG. 1 for illustration purposes. In an example embodiment, PLCs $140_1$ and $140_2$ are electrically connected to the external electrical circuits/devices through electrical circuit 110 and might not have any direct external electrical connections that bypass electrical circuit 110.

PLCs $140_1$ and $140_2$ are optically interconnected as described in more detail below. PLC $140_1$ is further optically connected to one or more external optical and/or optoelectronic circuits/devices using one or more optical fibers 132, only one of which is explicitly shown in FIG. 1 for illustration purposes. In an example embodiment, PLC $140_2$ is optically connected to the external optical and/or optoelectronic circuits/devices through PLC $140_1$ and might not have any direct external optical connections that bypass PLC $140_1$.

Heat sink 190 can be optional and generally operates to help maintain the temperatures of electrical circuit 110 and PLCs $140_1$ and $140_2$ within respective acceptable temperature ranges. In an example embodiment, heat sink 190 may be thermally coupled to electrical circuit 110 and PLCs $140_1$ and $140_2$, e.g., as indicated in FIG. 1, using one or more thermally conducting couplers 188. Heat sink 190 may also include a microfluidic channel 192 and a plurality of fins 194 configured to facilitate heat dissipation and removal from optoelectronic circuit 100 as known in the pertinent art. In an alternative embodiment, an additional heat sink (not explicitly shown in FIG. 1) analogous to heat sink 190 can be placed next to electrical circuit 110.

In an example embodiment, electrical circuit 110 comprises a substantially planar substrate 106 whose lateral dimensions (e.g., length and width) are larger than its thickness $d_0$ indicated in FIG. 1. The opposing surfaces of substrate 106 have patterned electrically conducting (e.g., metal) layers 104 and 108, respectively. Some conducting tracks of layers 104 and 108 are electrically connected to one another using a plurality of electrical vias 105. Layers 104 and 108 have conducting-track patterns (not explicitly shown in FIG. 1) that are configured to provide electrical connections between various portions of substrate 106 in a manner that enables proper operation of (i) various electronic integrated circuits (e.g., chips or dies) 112 directly attached and electrically connected to layer 104 and (ii) the PLCs $140_1$ and $140_2$, which are electrically connected to layer 108.

For illustration purposes and without any implied limitations, substrate 106 is shown in FIG. 1 as having four electronic integrated circuits $112_1$-$112_4$ attached to layer 104. Although electronic integrated circuits $112_1$-$112_4$ are illustratively shown in FIG. 1 as being attached to layer 104 using ball grid arrays $111_1$-$111_4$, respectively, alternative surface-mount technologies can also be used in alternative embodiments. In an alternative embodiment, substrate 106 may have a different (from four) number of electronic integrated circuits 112 attached to layer 104. In various embodiments, electronic integrated circuits 112 may include, e.g., one or more of the following: (i) a digital signal processor; (ii) a memory; (iii) a microcontroller; (iv) an analog-to-digital converter; (v) a digital-to-analog converter; and (vi) a power converter. In some embodiments, substrate 106 may have additional electronic integrated circuits 112 directly attached to layer 108.

PLC $140_1$ comprises a substantially planar (e.g., semiconductor) substrate $126_1$ whose lateral dimensions (e.g., length and width) are larger than its thickness $d_1$ indicated in FIG. 1. The opposing surfaces of substrate $126_1$ have patterned electrically conducting (e.g., metal) layers $124_1$ and $128_1$, respectively. Some conducting tracks of layers $124_1$ and $128_1$ are electrically connected to one another using a plurality of electrical vias 125. Layer $124_1$ is further electrically connected to layer 108 of electrical circuit 110 using a plurality of solder balls 116. Layer $128_1$ is further electrically connected to an electrically conducting layer $124_2$ of PLC $140_2$ using a plurality of solder balls 156.

Substrate $126_1$ also has planar waveguide layers $134_1$ and $138_1$ that are adjacent to the surfaces having electrically conducting layers $124_1$ and $128_1$, respectively. Each of waveguide layers $134_1$ and $138_1$ is patterned to create a respective plurality of (e.g., ridge) waveguides configured to provide optical paths/connections between different portions of substrate $126_1$ in a manner that enables proper operation of various optoelectronic devices 144 attached to that substrate. In various embodiments, optoelectronic devices 144 may include, e.g., one or more of the following: (i) a photodiode; (ii) an optical amplifier; (iii) an optical modulator; (iv) an optical switch; and (v) a laser diode. Each of optoelectronic devices 144 is electrically connected to one or both of electrically conducting layers $124_1$ and $128_1$ to receive and/or output the corresponding electrical signals used or generated by that optoelectronic device during its operation.

In an example embodiment, proper operation of optoelectronic devices 144 of PLC $140_1$ is supported by auxiliary electrical circuits 148 that are fixedly attached and electrically connected to electrically conducting layers $124_1$ and/or $128_1$. Each auxiliary electrical circuit 148 can be implemented using a conventional packaged electronic IC, a die, or a set of discrete electrical elements. For illustration purposes, PLC $140_1$ is shown in FIG. 1 as having five auxiliary electrical circuits 148 (labeled $148_1$-$148_5$). A person of ordinary skill in the art will understand that the number and type of optoelectronic devices 144 and the number and type of auxiliary electrical circuits 148 used in PLC $140_1$ depend on the intended function and/or application of that PLC and may vary from embodiment to embodiment.

For example, optoelectronic device $144_1$ may be a photodiode. Photodiode $144_1$ is electrically connected to layer $124_1$ by way of solder bumps 145. Photodiode $144_1$ is optically coupled to a corresponding optical waveguide of layer $134_1$ by way of a corresponding turning mirror 146. Mirror 146 has a slanted reflective surface that changes the propagation direction of the light received from the corresponding optical waveguide to cause the reflected light to impinge onto a photosensitive area of photodiode $144_1$. The electrical signal generated by photodiode $144_1$ in response to the received light is then transferred, e.g., as indicated in FIG. 1, to a transimpedance amplifier $148_1$ that is fixedly attached and electrically connected to electrically conducting layer $128_1$.

As another example, optoelectronic device $144_2$ may be an optical modulator. Optical modulator $144_2$ modulates light in response to one or more electrical signals applied to it, e.g., as indicated in FIG. 1, by a driver circuit $148_2$ that is fixedly attached and electrically connected to electrically conducting layer $128_1$. Optical modulator $144_2$ is optically coupled to the corresponding optical waveguides of layer $134_1$ using the corresponding ball lenses 150. More specifically, a first pair of ball lenses 150 is configured to couple light from a first optical waveguide of layer $134_1$ into optical modulator $144_2$, where the received light may be phase- and/or amplitude-modulated. A second pair of ball lenses 150 then operates to couple the resulting modulated light into a second optical waveguide of layer $134_1$.

As yet another example, optoelectronic device $144_3$ may be a laser diode. Laser diode $144_3$ generates light in response to one or more electrical signals applied to it, e.g., as indicated in FIG. 1, by a driver circuit $148_4$ that is fixedly attached and electrically connected to electrically conducting layer $128_1$. Laser diode $144_3$ is optically coupled to the corresponding optical waveguide of layer $134_1$ using a corresponding pair of ball lenses 150. In the shown example, laser diode $144_3$ and the corresponding pair of ball lenses 150 are locally encapsulated using a suitable (e.g., polymeric) filler 162 and a retaining bracket or cap 164. In an alternative embodiment, local encapsulation can be implemented by bonding a window onto a seal ring over the circuit components that are being encapsulated.

PLC $140_2$ is similar to PLC $140_1$, and the generally analogous elements of the two PLCs are labeled in FIG. 1 using the same numerical labels (with the exception of the subscripts). In an example embodiment, PLC $140_2$ comprises a substantially planar substrate $126_2$, patterned electrically conducting layers $124_2$ and $128_2$, patterned planar waveguide layers $134_2$ and $138_2$, a respective plurality of electrical vias 125, a respective plurality of ball lenses 150, optoelectronic devices $144_4$-$144_7$, and auxiliary electrical circuits $148_6$-$148_{11}$. Substrate $126_2$ has lateral dimensions that are larger than its thickness $d_2$ indicated in FIG. 1. Optoelectronic devices $144_4$-$144_7$ may include, e.g., one or more of the following: (i) a photodiode; (ii) an optical modulator; (iii) an optical amplifier; (iv) an optical switch; and (v) a laser diode. Auxiliary electrical circuits $148_6$-$148_{11}$ may include, e.g., one or more of the following: (i) an amplifier; (ii) a driver circuit; and (iii) a control circuit. A person of ordinary skill in the art will understand that the number and type of optoelectronic devices 144 and the number and type of auxiliary electrical circuits 148 used in PLC $140_2$ depend on the intended function and/or application of that PLC and may vary from embodiment to embodiment.

As indicated in FIG. 1, PLCs $140_1$ and $140_2$ are arranged in a stack in which optical signals can be transferred between various waveguides of planar waveguide layers $134_1$, $134_2$, $138_1$, and $138_2$ by way of through-substrate vias 170. For illustration purposes and without any implied limitations, only three such vias (labeled $170_1$-$170_3$) are shown in FIG. 1. More specifically, PLC $140_1$ is shown as having the via $170_1$. PLC $140_2$ is shown as having the vias $170_2$ and $170_3$. In general, any desired number (that is feasible from the engineering viewpoint) of vias 170 can be incorporated into PLCs $140_1$ and $140_2$ to provide optical paths for optical-signal transfer between various waveguides of planar waveguide layers $134_1$, $134_2$, $138_1$, and $138_2$.

For example, the vias $170_1$ and $170_2$ are aligned with one another to create an optical path between an optical waveguide of planar waveguide layer $134_1$ and an optical waveguide of planar waveguide layer $138_2$. Two slanted mirrors 146 inserted at the opposing ends of the vias $170_1$ and $170_2$ as indicated in FIG. 1 appropriately change the propagation direction of light from being substantially orthogonal to the main planes of PLCs $140_1$ and $140_2$ to being parallel to those planes, or vice versa. As a result, an optical signal can cross substrates $126_1$ and $126_2$ by way of the optical path created by the vias $170_1$ and $170_2$ and be coupled in and out of the corresponding optical waveguides of the planar waveguide layers $134_1$ and $138_2$. In some embodiments, slanted mirror 146 can be augmented by an appropriate lens (see, e.g., FIG. 2).

The via $170_3$ is configured to create an optical path between an optical waveguide of planar waveguide layer $134_2$ and an optical waveguide of planar waveguide layer $138_2$. Two slanted mirrors 146 inserted at the opposing ends of the via $170_3$ as indicated in FIG. 1 appropriately change the propagation direction of light from being substantially orthogonal to the main plane of PLCs $140_2$ to being parallel to that plane, or vice versa. As a result, an optical signal can cross substrate $126_2$ by way of the optical path created by the via $170_3$ and be coupled in and out of the corresponding optical waveguides of the planar waveguide layers $134_2$ and $138_2$.

As used herein, the term "via" refers to an opening (e.g., a hole or channel) that passes completely through the corresponding substrate (such as a wafer or die). The cross-sectional shape of the opening may or may not be uniform along the length of the via. The via can be filled, partially of completely, with one or more filler materials. A via can be designed and configured for providing an optical connection, an electrical connection, or both. For example, a via configured to provide an electrical connection is typically filled with metal, which is not optically transparent. In contrast, a via configured to provide an optical connection is typically unfilled or only partially filled and, as such, is optically transparent. In some embodiments, such a via may be filled with an optically transparent material, such as glass or silicon oxide.

In some embodiments, one or both of substrates $126_1$ and $126_2$ may have embedded therein one or more passive electrical components, such as resistors, capacitors, and inductors, that are electrically connected to conducting tracks of one or both of the corresponding electrically conducting layers 124 and 128 using the corresponding electrical vias 125.

In some embodiments, one or both of substrates $126_1$ and $126_2$ may have therein one or more microfluidic channels 182 for improved heat removal from PLCs $140_1$ and $140_2$. For illustration purposes, substrate $126_2$ is shown in FIG. 1 as having four microfluidic channels 182 located in proximity to optoelectronic device $144_6$. A person of ordinary skill in the art will understand that, in an alternative embodiment, a different configuration of microfluidic channels 182 can similarly be used.

Figure 2:
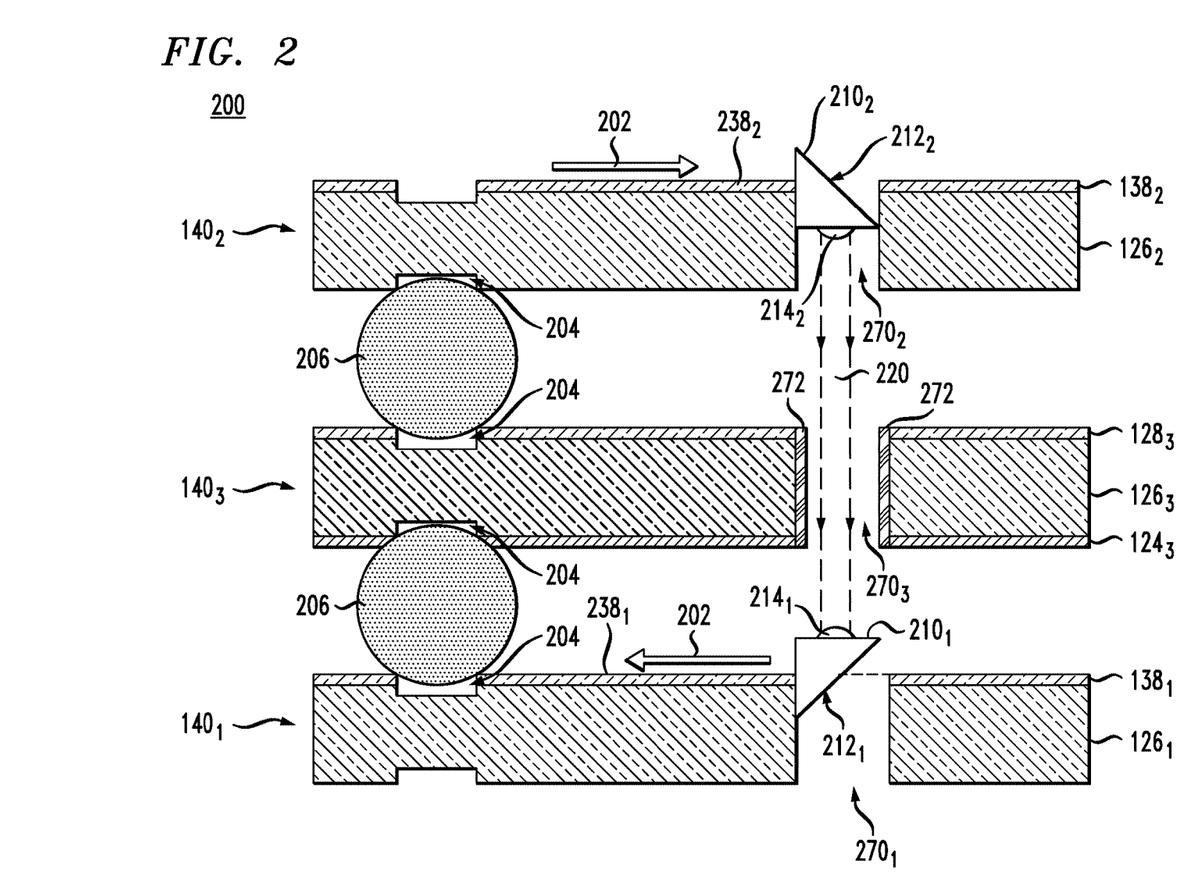
FIG. 2 shows a schematic side view of a stack of planar lightwave circuits that can be used in the optoelectronic circuit of FIG. 1 according to an embodiment.

FIG. 2 shows a schematic side view of a stack 200 of PLCs that can be used in optoelectronic circuit 100 (FIG. 1) according to an embodiment. For illustration purposes, stack 200 is shown in FIG. 2 as including PLCs $140_1$-$140_3$. For clarity of depiction, some of the constituent layers of PLCs $140_1$-$140_3$ are not explicitly shown in FIG. 2. In an a alternative embodiment, stack 200 may have a different (from three) number of PLCs.

PLC $140_1$ comprises an optical waveguide $238_1$ that is a part of planar waveguide layer $138_1$ (also see FIG. 1). PLC $140_2$ comprises an optical waveguide $238_2$ that is a part of planar waveguide layer $138_2$ (also see FIG. 1). PLCs $140_1$-$140_3$ have vias $270_1$-$270_3$, respectively, that create an optical path that enables an optical signal 202 to be transferred, e.g., as indicated in FIG. 2, from optical waveguide $238_2$ of PLC $140_2$ to optical waveguide $238_1$ of PLC $140_1$.

Each of the vias $270_1$-$270_3$ provides an opening in the respective one of substrates $126_1$-$126_3$. The longitudinal axes of the vias $270_1$-$270_3$ can be aligned (made collinear) with one another, e.g., as indicated in FIG. 2, using alignment grooves 204 and alignment balls 206. The via $270_2$ has an optical prism $210_2$ positioned therein in a manner that causes a facet $212_2$ of that optical prism to function as a turning mirror for the light that exits optical waveguide $238_2$. A lens $214_2$ attached to another facet of optical prism $210_2$ is then used to collimate the light of optical signal 202 and direct a resulting collimated optical beam 220 through the via $270_2$ of substrate $126_2$ toward PLCs $140_3$ and $140_1$.

Optical beam 220 first passes through the via $270_3$, thereby crossing substrate $126_3$ of PLCs $140_3$ as indicated in FIG. 2. Optical beam 220 then impinges onto an optical prism $210_1$ positioned in the via $270_1$ of substrate $126_1$. A facet $212_1$ of optical prism $210_1$ operates as a turning mirror that causes the light of optical beam 220 to be directed toward optical waveguide $238_1$. A lens $214_1$ attached to another facet of optical prism $210_1$ is used to compress optical beam 220 for better coupling the light thereof into optical waveguide $238_1$. As a result, optical signal 202 can be transferred from optical waveguide $238_2$ of PLC $140_2$ to optical waveguide $238_1$ of PLC $140_1$ with relatively low optical losses.

A person of ordinary skill in the art will understand that arrangements of turning mirrors and lenses similar to that shown in FIG. 2 can be used to create one or more additional optical paths for transferring optical signals between optical waveguides located in any pair of planar waveguide layers of PLCs $140_1$-$140_3$. For example, some of such optical paths can be used to transfer optical signals between the optical waveguides located in planar waveguide layers 134 and 138, respectively, of the same PLC 140 (see, e.g., the via $170_3$ shown in FIG. 1). Some of such optical paths can be used to transfer optical signals between the optical waveguides located in respective planar waveguide layers of different PLCs 140 (see, e.g., the vias $170_1$ and $170_2$ shown in FIG. 1). In particular, vias, turning mirrors, and lenses can be arranged to create optical paths for transferring optical signals as follows: (i) between an optical waveguide located in planar waveguide layer 134 of one PLC 140 and an optical waveguide located in planar waveguide layer 134 of another PLC 140; (ii) between an optical waveguide located in planar waveguide layer 134 of one PLC 140 and an optical waveguide located in planar waveguide layer 138 of another PLC 140; and (iii) between an optical waveguide located in planar waveguide layer 138 of one PLC 140 and an optical waveguide located in planar waveguide layer 138 of another PLC 140.

In some alternative embodiments, stack 200 may have more than three PLCs 140. In such embodiments, some of the optical paths for transferring optical signals between different PLCs 140 of stack 200 may cross more than one PLC 140 in a manner similar to that indicated in FIG. 2 for PLC $140_3$.

In some embodiments, some of the vias that provide optical connections can also be configured to additionally provide electrical connections. The via $270_3$ shown in FIG. 2 is an example of such a dual-function (optical/electrical) via. More specifically, side walls of the via $270_3$ are coated with a film 272 of an electrically conducting material (e.g., a metal) in a manner that causes the film to connect electrically conducting layers $124_3$ and $128_3$ of PLC $140_3$. At the same time, film 272 is relatively thin, which causes it to leave a sufficient unfilled opening in the middle portion of the via $270_3$ for optical beam 220 to pass through unimpeded, e.g., as indicated in FIG. 2.

Figure 3:
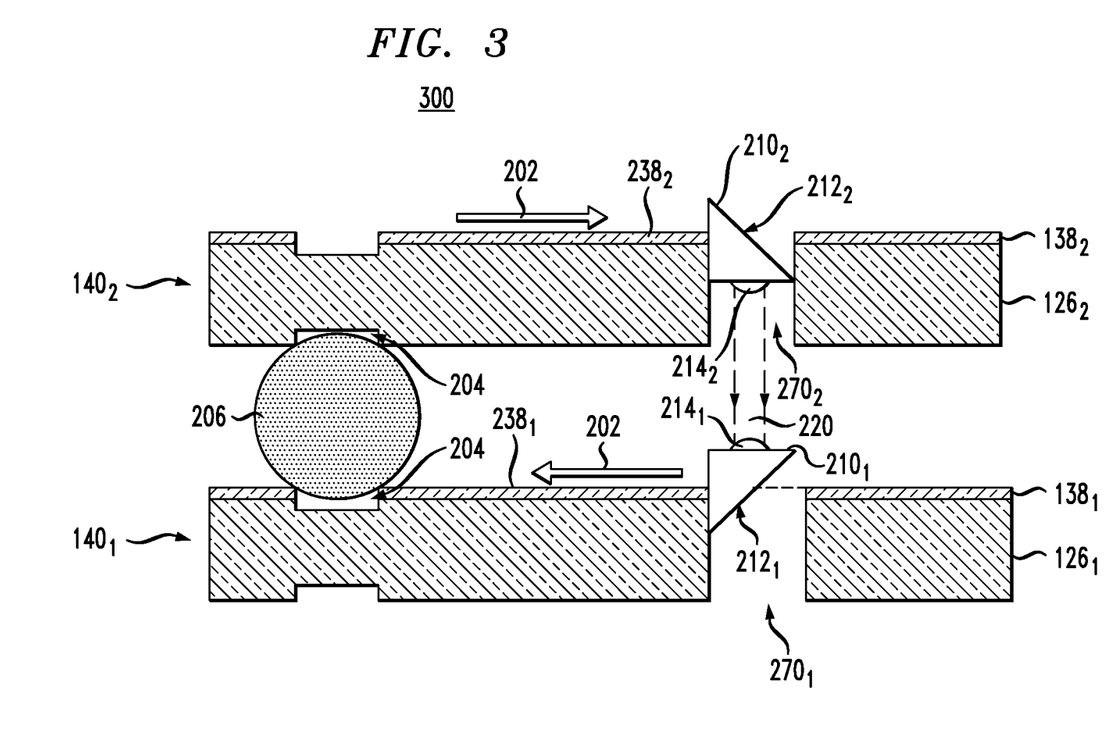
FIG. 3 shows a schematic side view of a stack of planar lightwave circuits according to an alternative embodiment.

FIG. 3 shows a schematic side view of a stack 300 of two PLCs 140 according to an alternative embodiment. For illustration purposes, stack 300 is shown in FIG. 3 as including PLCs $140_1$ and $140_2$. For clarity of depiction, some of the constituent layers of PLCs $140_1$-$140_2$ are not explicitly shown in FIG. 3.

Stack 300 is generally analogous to stack 200 shown in FIG. 2 and is constructed using many of the same structural and functional elements as stack 200. These elements are labeled in FIG. 3 using the same labels as in FIG. 2. The description of these elements is already provided above in reference to FIG. 2 and is not repeated here. However, stack 300 differs from stack 200 in that PLC $140_3$ is not present in stack 300. As a result, optical beam 220 in stack 300 crosses only one substrate, i.e., $126_2$, by passing through the via $270_2$ as indicated in FIG. 3.

Figure 4:
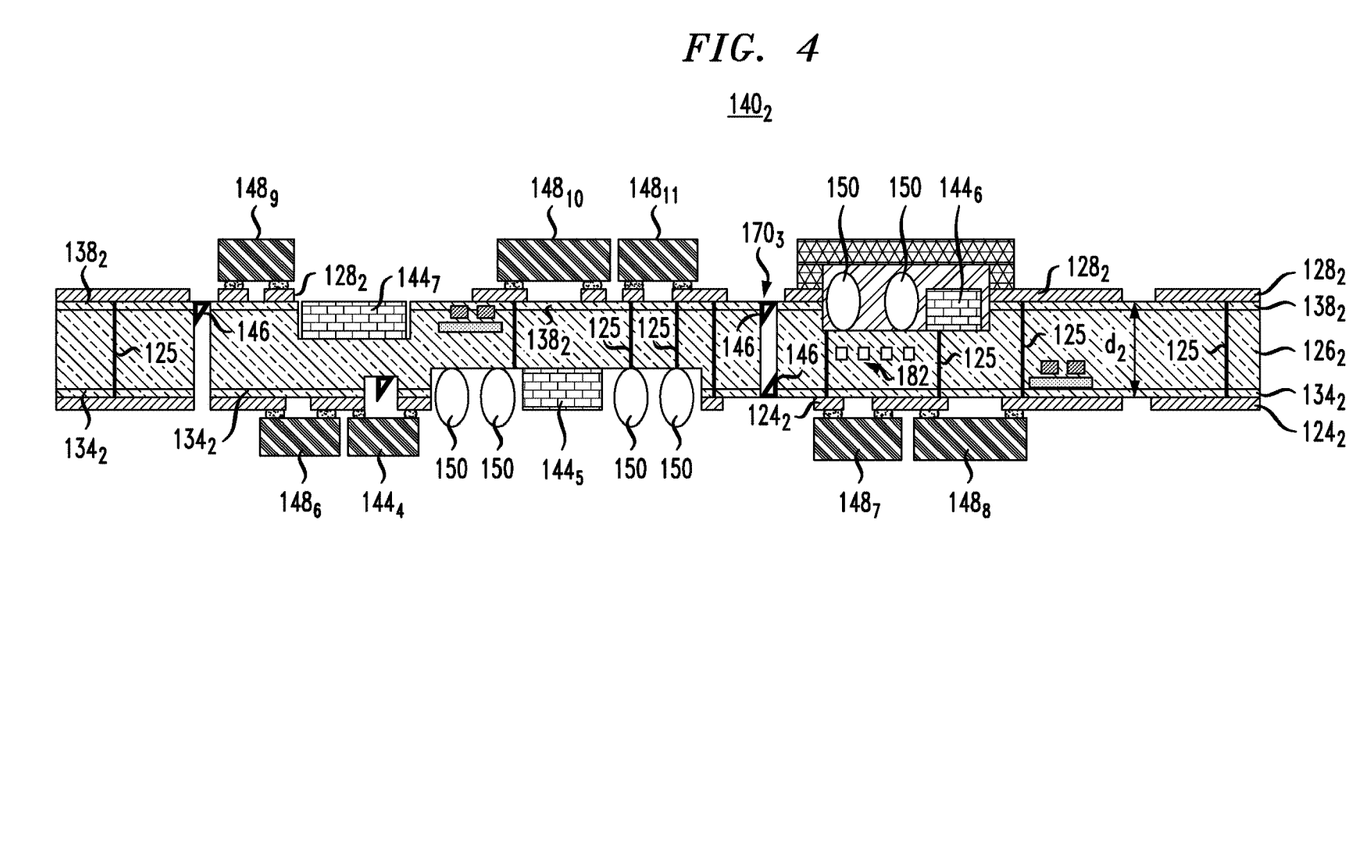
FIG. 4 shows a schematic side view of a planar lightwave circuit according to an alternative embodiment.

FIG. 4 shows a schematic side view of PLC $140_2$ according to an alternative embodiment. In the shown embodiment, PLC $140_2$ is a stand-alone piece of equipment. For example, this particular embodiment can be made by one party (e.g., a part supplier) and then sold to another party (e.g., an assembly maker). The latter party can then use the supplied PLC $140_2$ along with other pertinent parts to assemble an embodiment of optoelectronic circuit 100 (see FIG. 1).

According to an example embodiment disclosed above in reference to FIGS. 1-4, provided is an apparatus (e.g., 100, FIG. 1, or $140_2$, FIG. 4) comprising: a substantially planar substrate (e.g., $126_2$, FIG. 1) having opposing first and second surfaces; a first planar optical waveguide (e.g., part of $134_2$, FIGS. 1, 4) located at the first surface; a second planar optical waveguide (e.g., part of $138_2$, FIGS. 1, 4) located at the second surface; a first optoelectronic device (e.g., $144_5$, FIGS. 1, 4) located at the first surface; and a second optoelectronic device (e.g., $144_6$, FIGS. 1, 4) located at the second surface; and wherein the substantially planar substrate has a via (e.g., $170_3$, FIG. 1) crossing said substrate and configured to optically connect the first planar optical waveguide and the second planar optical waveguide.

In some embodiments of the above apparatus, the apparatus further comprises: a first electrical circuit (e.g., $148_8$, FIG. 1) located at the first surface; and a second electrical circuit (e.g., $148_{10}$, FIG. 1) located at the second surface; and wherein the first and second electrical circuits are electrically connected to support operation of one or both of the first and second optoelectronic devices.

In some embodiments of any of the above apparatus, the first electrical circuit comprises a first electronic controller connected to control the first optoelectronic device; and the second electrical circuit comprises a second electronic controller connected to control the second optoelectronic device.

In some embodiments of any of the above apparatus, the first electrical circuit comprises an electronic controller connected to control the second optoelectronic device; and the substantially planar substrate has at least one electrical via (e.g., 125, FIG. 1) crossing said substrate and configured to electrically connect the first electrical circuit and the second optoelectronic device.

In some embodiments of any of the above apparatus, at least one of the first and second electrical circuits comprises one or more of the following: an electrical amplifier; a driver circuit; a control circuit; and a digital circuit.

In some embodiments of any of the above apparatus, the apparatus further comprises: a first ball grid array on the first surface that electrically connects the first electrical circuit to a plurality of conducting tracks (e.g., $124_2$, FIG. 1) on the first surface; and a second ball grid array on the second surface that electrically connects the second electrical circuit to a plurality of conducting tracks (e.g., $128_2$, FIG. 1) on the second surface.

In some embodiments of any of the above apparatus, at least one of the first and second optoelectronic devices comprises one or more of the following: a photodiode; an optical amplifier; an optical modulator; an optical switch; and a coherent light source.

In some embodiments of any of the above apparatus, the apparatus further comprises a first turning mirror (e.g., 146, FIG. 1) located at a first end of the via and configured to direct light received from the first planar optical waveguide through the via in a direction substantially (e.g., within ±15 degrees) orthogonal to the substantially planar substrate.

In some embodiments of any of the above apparatus, the apparatus further comprises a second turning mirror (e.g., another 146 of $170_3$, FIG. 1) located at an opposite second end of the via and configured to couple light received from the first turning mirror into the second planar optical waveguide by directing said light in a direction substantially (e.g., within ±15 degrees) parallel to the substantially planar substrate.

In some embodiments of any of the above apparatus, the first optoelectronic device is optically coupled to the first planar optical waveguide; the second optoelectronic device is optically coupled to the second planar optical waveguide; and light transmitted between the first optoelectronic device and the second optoelectronic device passes through the via.

In some embodiments of any of the above apparatus, the substantially planar substrate has one or more microfluidic channels (e.g., 182, FIG. 1).

In some embodiments of any of the above apparatus, the apparatus further comprises: at least one other optoelectronic device (e.g., $144_4$, FIG. 1) located at the first surface; and at least one other optoelectronic device (e.g., $144_7$, FIG. 1) located at the second surface.

In some embodiments of any of the above apparatus, the apparatus further comprises: at least one other electrical circuit (e.g., $148_7$, FIG. 1) located at the first surface; and at least one other electrical circuit (e.g., $148_{11}$, FIG. 1) located at the second surface; and wherein said other electrical circuits are electrically connected to support operation of one or both of said other optoelectronic devices.

According to another example embodiment disclosed above in reference to FIGS. 1-4, provided is an apparatus (e.g., 100, FIG. 1; 200, FIG. 2; or 300, FIG. 3) comprising: a stack (e.g., 200, FIG. 2; 300, FIG. 3) of two or more substantially planar substrates (e.g., $126_1$-$126_2$, FIG. 3, or $126_1$-$126_3$, FIG. 2), each having respective opposing first and second surfaces and a respective planar optical waveguide (e.g., 238, FIG. 2) located at one of said first and second surfaces thereof; and wherein the respective planar optical waveguides of two of the two or more substantially planar substrates are optically connected via a respective optical path that passes through at least one via (e.g., 270, FIGS. 2-3) crossing a respective substrate of the two or more substantially planar substrates of the stack.

In some embodiments of the above apparatus, the apparatus further comprises a first mirror (e.g., $212_2$, FIG. 2) configured to direct light between an end of one of the respective planar optical waveguides and the at least one via.

In some embodiments of any of the above apparatus, the apparatus further comprises a second mirror (e.g., $212_1$, FIG. 2) configured to direct light between the at least one via and an end of another one of the respective planar optical waveguides.

In some embodiments of any of the above apparatus, the at least one via has a metal film (e.g., 272, FIG. 2) on a wall thereof, the metal film electrically connecting the respective opposing first and second surfaces.

In some embodiments of any of the above apparatus, the stack includes: a first substantially planar substrate (e.g., $126_2$, FIG. 2) having a first planar optical waveguide (e.g., $238_2$, FIG. 2) located at a surface thereof and a first via (e.g., $270_2$, FIG. 2) crossing the first substantially planar substrate; and a second substantially planar substrate (e.g., $126_1$, FIG. 2) having a second planar optical waveguide (e.g., $238_1$, FIG. 2) located at a surface thereof; and wherein the first and second planar optical waveguides are optically connected via an optical path (e.g., for 220, FIG. 2) that passes through the first via.

In some embodiments of any of the above apparatus, the stack further includes a third substantially planar substrate (e.g., $126_3$, FIG. 2) having a second via (e.g., $270_3$, FIG. 2) crossing the third substantially planar substrate; and wherein the optical path further passes through the second via.

In some embodiments of any of the above apparatus, the stack includes: a first substantially planar substrate (e.g., $126_2$, FIG. 2) having a first planar optical waveguide (e.g., $238_2$, FIG. 2) located at a surface thereof; a second substantially planar substrate (e.g., $126_1$, FIG. 2) having a second planar optical waveguide (e.g., $238_1$, FIG. 2) located at a surface thereof; and a third substantially planar substrate (e.g., $126_3$, FIG. 2) located between the first and second substantially planar substrates in the stack, the third substantially planar substrate having an via (e.g., $270_3$, FIG. 2) crossing said third substantially planar substrate; and wherein the first and second planar optical waveguides are optically connected via an optical path (e.g., for 220, FIG. 2) that passes through the via.

While this disclosure includes references to illustrative embodiments, this specification is not intended to be construed in a limiting sense. Various modifications of the described embodiments, as well as other embodiments within the scope of the disclosure, which are apparent to persons skilled in the art to which the disclosure pertains are deemed to lie within the principle and scope of the disclosure, e.g., as expressed in the following claims.

Unless explicitly stated otherwise, each numerical value and range should be interpreted as being approximate as if the word "about" or "approximately" preceded the value or range.

It will be further understood that various changes in the details, materials, and arrangements of the parts which have been described and illustrated in order to explain the nature of this disclosure may be made by those skilled in the art without departing from the scope of the disclosure, e.g., as expressed in the following claims.

Reference herein to "one embodiment" or "an embodiment" means that a particular feature, structure, or characteristic described in connection with the embodiment can be included in at least one embodiment of the disclosure. The appearances of the phrase "in one embodiment" in various places in the specification are not necessarily all referring to the same embodiment, nor are separate or alternative embodiments necessarily mutually exclusive of other embodiments. The same applies to the term "implementation."

Throughout the detailed description, the drawings, which are not to scale, are illustrative only and are used in order to explain, rather than limit the disclosure. The use of terms such as height, length, width, top, bottom, is strictly to facilitate the description of the embodiments and is not intended to limit the embodiments to a specific orientation. For example, height does not imply only a vertical rise limitation, but is used to identify one of the three dimensions of a three dimensional structure as shown in the figures. Such "height" would be vertical where the substrates are horizontal but would be horizontal where the substrates are vertical, and so on. Similarly, while all figures show the different layers as horizontal layers such orientation is for descriptive purpose only and not to be construed as a limitation.

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

The description and drawings merely illustrate the principles of the disclosure. It will thus be appreciated that those of ordinary skill in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and embodiments of the disclosure, as well as specific examples thereof, are intended to encompass equivalents thereof.

What is claimed is:

1. An apparatus comprising:
   a planar substrate having opposing first and second surfaces;
   a first planar optical waveguide located at the first surface;
   a second planar optical waveguide located at the second surface;
   a first optoelectronic device and a first packaged electronic integrated circuit located at the first surface, the first optoelectronic device being optically coupled to the first planar optical waveguide; and
   a second optoelectronic device and a second packaged electronic integrated circuit located at the second surface, the second optoelectronic device being optically coupled to the second planar optical waveguide;
   wherein the planar substrate has a via crossing said substrate and configured to optically connect the first planar optical waveguide and the second planar optical waveguide such that light transmitted between the first optoelectronic device and the second optoelectronic device passes through the via; and
   wherein each of the first and second packaged electronic integrated circuits is electrically connected to one or both of the first and second optoelectronic devices using one or both of a plurality of conducting tracks on the first surface and a plurality of conducting tracks on the second surface.

2. The apparatus of claim 1, further comprising:
   a first electronic controller connected to control the first optoelectronic device, the first electronic controller including the first packaged electronic integrated circuit; and
   a second electronic controller connected to control the second optoelectronic device, the second electronic controller including the second packaged electronic integrated circuit.

3. The apparatus of claim 1, further comprising
   an electronic controller connected to control the second optoelectronic device, the electronic controller including the first packaged electronic integrated circuit; and
   wherein the planar substrate has at least one additional via crossing said substrate and configured to electrically connect the first packaged electronic integrated circuit and the second optoelectronic device.

4. The apparatus of claim 1, wherein at least one of the first and second packaged electronic integrated circuits comprises one or more of the following:
   an electrical amplifier;
   a driver circuit;
   a control circuit; and
   a digital circuit.

5. The apparatus of claim 1, further comprising:
   a first ball grid array on the first surface that directly electrically connects the first packaged electronic integrated circuit to the plurality of conducting tracks on the first surface; and
   a second ball grid array on the second surface that directly electrically connects the second packaged electronic integrated circuit to the plurality of conducting tracks on the second surface.

6. The apparatus of claim 1, wherein at least one of the first and second optoelectronic devices comprises one or more of the following:
   a photodiode;
   an optical amplifier;
   an optical modulator;
   an optical switch; and
   a coherent light source.

7. The apparatus of claim 1, further comprising a first turning mirror located at a first end of the via and configured to direct light received from the first planar optical waveguide through the via in a direction substantially orthogonal to the planar substrate.

8. The apparatus of claim 7, further comprising a second turning mirror located at an opposite second end of the via and configured to couple light received from the first turning mirror into the second planar optical waveguide by directing said light in a direction substantially parallel to the planar substrate.

9. The apparatus of claim 1, wherein the planar substrate has one or more microfluidic channels.

10. The apparatus of claim 1, further comprising:
    at least one other optoelectronic device located at the first surface; and
    at least one other optoelectronic device located at the second surface.

11. The apparatus of claim 10, further comprising:
    at least one other packaged electronic integrated circuit located at the first surface; and
    at least one other packaged electronic integrated circuit located at the second surface; and
    wherein said other packaged electronic integrated circuits are electrically connected to support operation of one or both of said other optoelectronic devices.

* * * * *